United States Patent [19]

Lindmayer

[11] Patent Number: 5,007,037

[45] Date of Patent: * Apr. 9, 1991

[54] OPTICAL DISK DRIVE SYSTEM UTILIZING ELECTRON TRAPPING MEDIA FOR DATA STORAGE

[75] Inventor: Joseph Lindmayer, Potomac, Md.

[73] Assignee: Quantex Corporation, Rockville, Md.

[ * ] Notice: The portion of the term of this patent subsequent to Sep. 5, 2006 has been disclaimed.

[21] Appl. No.: 225,846

[22] Filed: Jul. 29, 1988

Related U.S. Application Data

[63] Continuation-in-part of Ser. No. 870,877, Jun. 5, 1986, Pat. No. 4,864,536, which is a continuation-in-part of Ser. No. 786,095, Oct. 10, 1985, Pat. No. 4,705,952.

[51] Int. Cl.$^5$ ............................................. G11B 7/00
[52] U.S. Cl. .................................................. 369/100
[58] Field of Search .................... 369/100, 45, 121; 346/76 L; 365/185, 230.1; 252/301.4 S; 428/690

[56] References Cited

U.S. PATENT DOCUMENTS

| | | |
|---|---|---|
| 2,521,124 | 9/1950 | Miller . |
| 2,522,074 | 9/1950 | Urbach . |
| 2,527,365 | 10/1950 | Leverenz . |
| 2,742,631 | 4/1956 | Rajchman et al. . |
| 2,979,467 | 4/1961 | Keller . |
| 3,767,588 | 10/1973 | Otomo et al. . |
| 4,064,066 | 12/1977 | Toshinai et al. . |
| 4,113,353 | 9/1978 | Matsushita . |
| 4,170,475 | 10/1979 | Kuehnle et al. . |
| 4,225,873 | 9/1980 | Winslow ............... 346/76 L |
| 4,458,345 | 7/1984 | Bjorklund et al. ............. 365/119 X |
| 4,549,083 | 10/1985 | Ozawa . |
| 4,556,964 | 12/1985 | Trethewey .................. 369/121 X |
| 4,598,395 | 7/1986 | Smith ..................... 369/100 |
| 4,661,833 | 4/1987 | Mizutani ................. 365/185 X |
| 4,704,635 | 11/1987 | Nudelman . |
| 4,812,660 | 3/1989 | Lindmayer ............... 252/301.4 S X |
| 4,818,434 | 4/1989 | Lindmayer .................. 252/301.4 S |
| 4,822,520 | 4/1989 | Lindmayer .................. 252/301.4 S |
| 4,830,875 | 5/1989 | Lindmayer ............... 252/301.4 S X |
| 4,839,092 | 6/1989 | Lindmayer .................. 252/301.4 S |
| 4,842,960 | 6/1989 | Lindmayer ..................... 428/690 |
| 4,855,603 | 8/1989 | Lindmayer .................. 252/301.4 S |
| 4,864,536 | 9/1989 | Lindmayer ................ 365/230.01 X |

FOREIGN PATENT DOCUMENTS

WO85/00089 11/1985 PCT Int'l Appl. .

OTHER PUBLICATIONS

Amnon; "Archival Optical Disc Data Storage"; Opt. Engr., May/Jun. 1981, vol. 20, No. 3, pp. 394–398.
Optical Disc Corporation—610A—Video Disc Recording System—Sales brochure.
S. P. Keller et al., "Studies on Some Infrared Stimulable Phosphors", *Physical Review*, vol. 108, No. 3, Nov. 1, 1957.
Lindmayer, "Infrared Phosphors as Sensors", *Sensors*, Mar. 1986.
Mims, II, "How to See Near-Infrared Radiation", *Modern Electronics*, May 1986.
Lindmayer, "A New Erasable Optical Memory", *Solid State Technology*, Aug. 1988.
Proceedings of the IEEE, pp. 425–426 entitled "Optical Memory Characteristics of a SrS(Eu, Sm) Phosphor" by Soref.
IBM Technical Disclosure Bulletin, vol. 23, No. 5, "Optical Dynamic Disk Storage Device", Duggan, Jr. et al., pp. 2040–2054, Oct. 1980.
Japanese publication, "Phosphor Disk Bit Storage", by Naito et al.

*Primary Examiner*—Donald McElheny, Jr.
*Attorney, Agent, or Firm*—Ostrolenk, Faber, Gerb & Soffen

[57] ABSTRACT

An erasable optical disk drive system is disclosed which utilizes an electron trapping media coated on the disk surface to store data in the form of light energy. Data is written onto the disk, which is contained in a light-tight contamination-free environment similar to a Winchester hard disk drive system, using a near infrared light laser beam. Data is read from the disk using a visible light laser beam. The entire optical disk drive system is designed to fit within a standard mini or 5¼ inch disk drive form factor for personal computers.

12 Claims, 6 Drawing Sheets

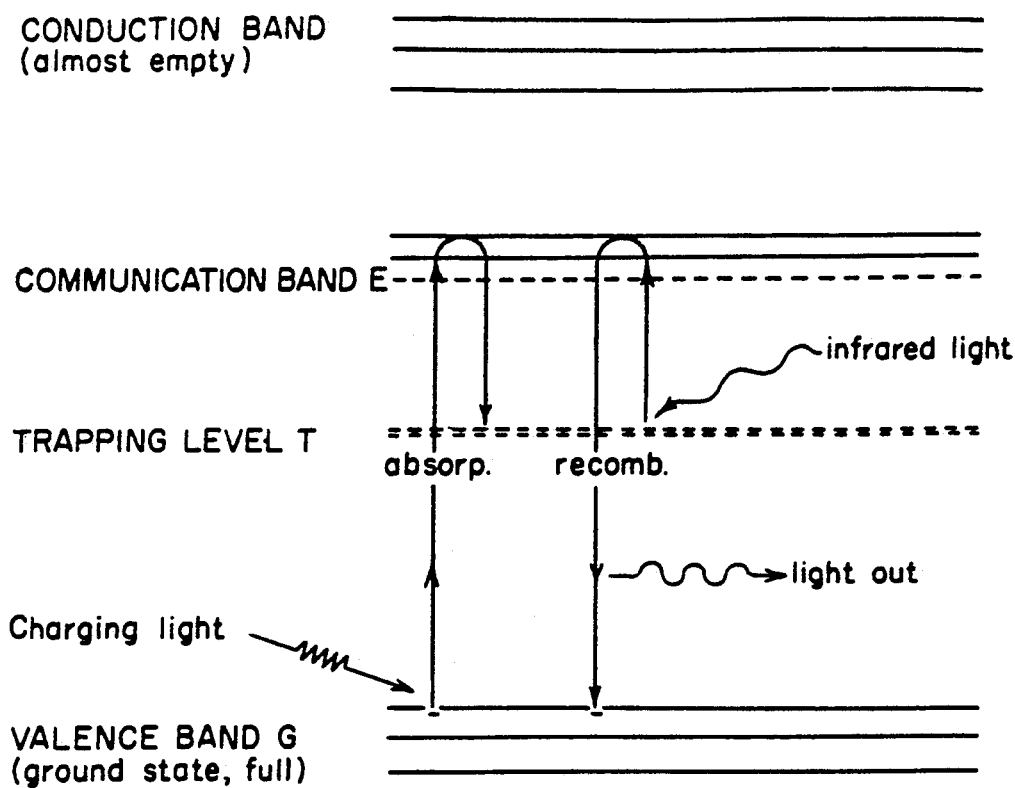
FIG. 1
FIG. 2
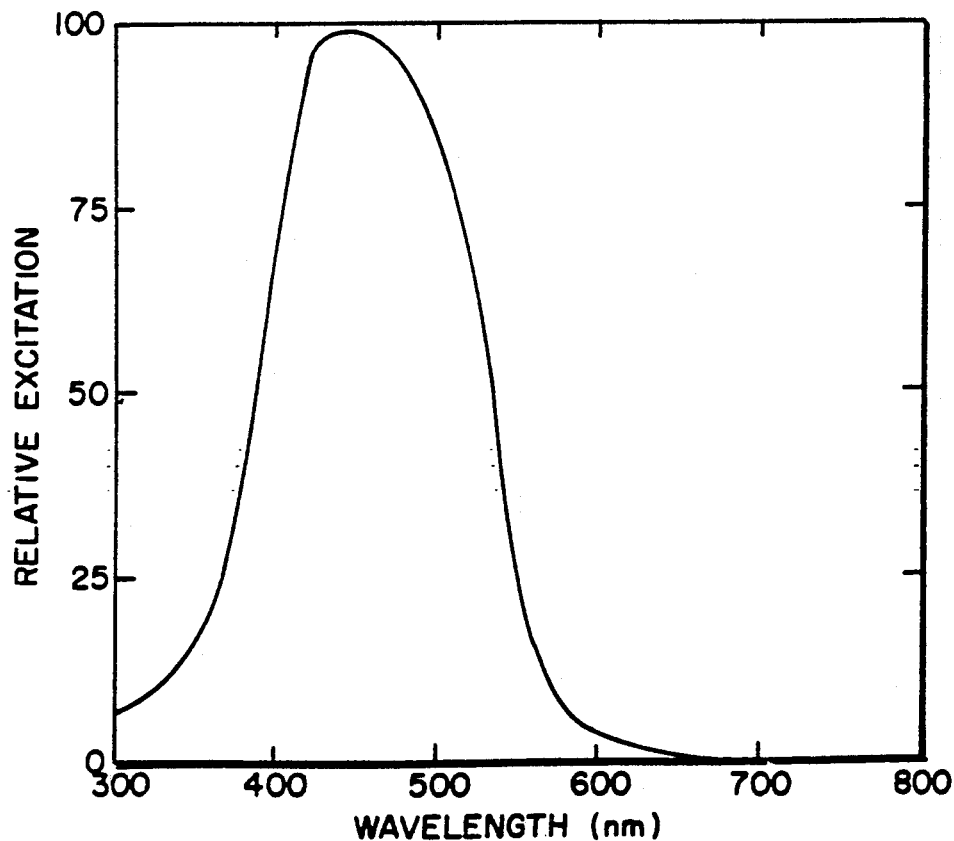

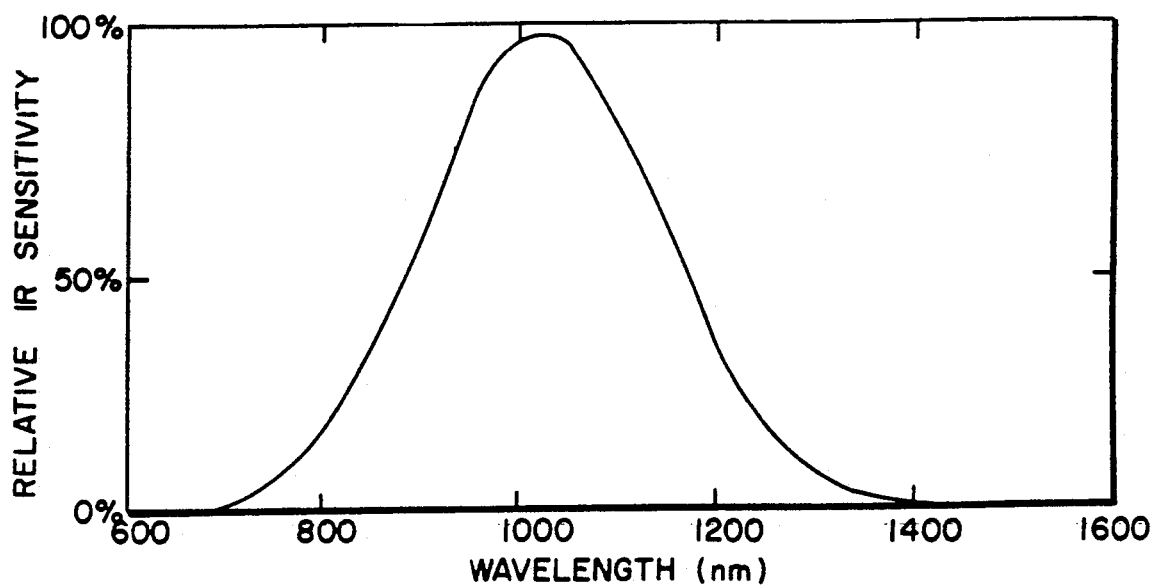
FIG. 3
FIG. 4
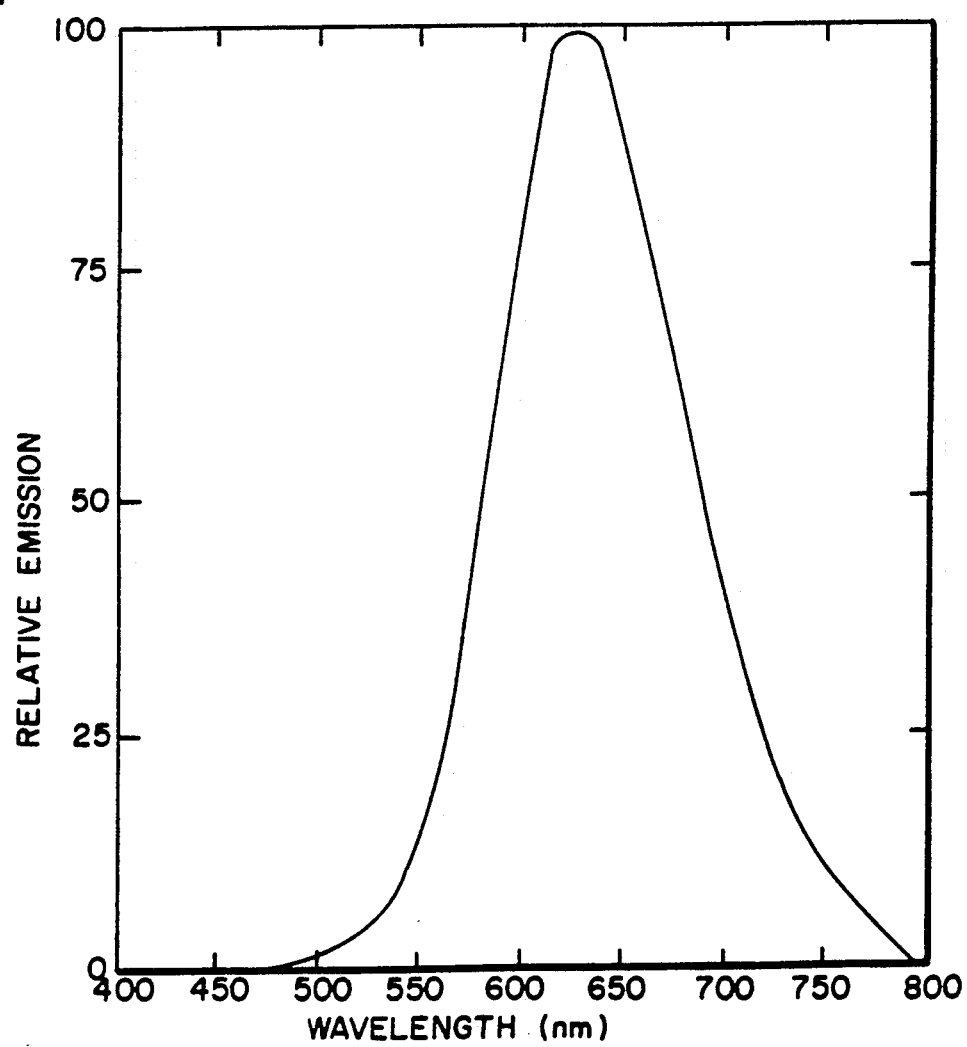

OPTICAL DISK DRIVE SYSTEM UTILIZING ELECTRON TRAPPING MEDIA FOR DATA STORAGE

BACKGROUND OF THE INVENTION

Cross Reference to Related Application

This is a continuation-in-part of U.S. application Ser. No. 870,877, filed June 5, 1986 now U.S. Pat. No. 4,864,536, entitled "Optical Memory Method and System," which is a continuation-in-part of U.S. patent application Ser. No. 786,095, filed Oct. 10, 1985, now U.S. Pat. No. 4,705,952, entitled "Communications Apparatus Using Infrared-Triggered Phosphor for Receiving Infrared Signals." The assignee herein is also the assignee of U.S. Pat. No. 4,915,982, entitled "Method of Making Thin Film Photoluminescent Articles", the disclosure of which is herein incorporated by reference.

The present invention relates generally to mass storage devices for data storage. More particularly, the present invention relates to a method of and apparatus for mass data or information storage utilizing purely photoelectronic processes for writing, reading, and erasing stored data.

Optical storage devices presently known generally permit two to three orders of magnitude more data to be stored per disk than with magnetic methods and apparatus. Because of the potential for much greater storage of data and also because of the enormous protected market for such optical memories, active development of optical storage devices is currently occurring in several different directions. Such activities are directed towards read-only, write-once-read many times (WORM) and erasable optical memory systems. While read only and WORM optical memories are already available, erasable optical memory systems have encountered much greater developmental difficulties than read-only WORM systems because the qualities of the storage media required present problems of much greater technical complexity.

Read-only optical memory devices for use as computer peripherals, such as CD-ROMs, became commercially available with the advent of the digital audio compact disk. Current disk data storage capacity for such units is 200-600 megabytes. Such disks are factory fabricated using a molding press and metalizing operations and are suitable for low cost distribution of large fixed database information.

WORM devices allow the user to encode his own data on the disk, however only once. Data bits are stored at physical locations by irreversibly "burning" the medium with a laser. Such permanent encoding can be read back indefinitely, thus making WORM technology suitable for archival storage of large quantities of information, including digitized images, where random access to a large database is desirable.

It is the third category of optical disk storage devices, namely erasable storage devices, that is believed to embody the greatest utility for mass storage purposes. Such devices will be competitive with present magnetic tape and disk mass storage, and will have a major impact on computer technology in the years ahead. At present, the three most active approaches now being pursued for erasable optical storage involve magneto-optical material systems, dye polymers, and techniques that produce crystal structure or phase transformation in the storage medium at the spot being written to. All of these approaches require heat which usually changes the physical or chemical structure of the materials in performing the write or erase function. Thus, the time to write data to such systems is dependent upon a certain "dwell" time during which the spot to which data is being written must be heated or otherwise physically transformed.

Another drawback with such approaches is that media performance is highly sensitive to impurities, impurity diffusion, oxidation, and other imperfections that propagate into defects and that only show up after multiple switching cycles or at times later than the manufacturing and testing of the devices. Of the three approaches discussed above, progress has been greatest with magneto-optic materials. Laboratory results in this area have reported millions of write/erase cycles. See, for example, H-P. D. Shieh Ph.D. Thesis, Carnegie-Mellon University, Pittsburgh, Pa. (1987).

In order to utilize erasable optical media for mass storage, the optical media must be fast enough to be marked at high data rates using low power lasers. The media must also maintain almost error-free data at acceptable computer industry standards for at least ten years, for example, no more than one uncorrectable error in $10^{12}$ bits. Thus, finding the right physical phenomenon to serve as the basis for erasablity in a high-speed, high-resolution optical storage medium for use with an optical disk storage system has been very difficult. Most of the effort in this area over the past ten years, as described above, has gone into the use of magneto-optic materials. However, the commercial realization of erasable magneto-optical storage has not yet been achieved, nor are there any guarantees that it ever will be. Unfortunately, the performance of the other approaches discussed above generally is not comparable.

In order to overcome the problems of the prior art, and provide a basis for a workable optical disk storage system, a new approach to the optical storage materials problem which satisfies the optical media requirements of density, speed and long cycle life has been developed. This development utilizes the phenomenon of electron trapping in a class of new materials which comprise an alkaline earth crystal typically doped with rare earth elements. Thin crystalline films of such materials are formed on various substrates, such as glass or alumina, in order to provide the disk storage medium.

Since the trapping phenomenon is a purely electronic process, read/write/erase operations can be performed very fast. In addition, the physical trapping phenomenon suggests that media life may be practically limitless. Also, the effect of electron trapping yields a linear response characteristic, which provides an analog dimension to the storage capability. Thus, for example, the potential disk storage capacity of a single 5½ inch disk could be extended to several gigabytes. Obviously, the density of stored information is extremely high.

The materials to be used as the media for the optical disk storage system described herein are the subject of U.S. Pat. No. 4,915,982, herein incorporated by reference, which is a continuation-in-part of U.S. Pat. Nos. 4,864,536 and 4,830,875. Other materials useful as the storage media herein are disclosed in U.S. Pat. Nos. 4,839,092; 4,806,772; 4,879,186; and 4,842,960, all of which are incorporated by reference herein. The assignee herein is the assignee in each of the above-noted patents.

The material described in U.S. Pat. No. 4,915,982 demonstrates an extremely linear relationship between the write input and the read output. Thus, this capability demonstrates a large noise margin for binary storage, as well as the possibility of increased information storage density when employed as an analog or multi-level digital memory medium. Multi-level refers to the fact that by writing with a plurality of intensities of the same laser beam, the linearity of the resulting emissions upon being impinged by a read laser beam is such that information can be stored and recognized at various "levels" of intensity, for example, at 0.2, 0.4, 0.6, 0.8 and 1 intensity. This particular media is in the form of a thin film and can be "charged" and "discharged" with light by exciting ground state electrons to an elevated energy level. Specifically, upon illumination by visible light, electrons are raised to high energy trapping states, where they can remain indefinitely. When later illuminated by infrared light, the electrons are released from the traps, emitting a new visible light. Thus, with such materials, digital data is stored and retrieved by using low energy lasers to trap and read the electrons at a particular location.

Such solid state photonic materials have electrons having bi-stable equilibrium states; one with electrons in a ground state, and the other in which electrons are "trapped" in a well-defined, specific elevated energy state. Electrons are raised to the higher energy state by the absorption of visible light photons, thus filling available trap sites. An electron in the elevated energy state can be released from its trap site by inputting sufficient energy to the electron to permit it to escape from the well. When that occurs, the electron falls back to its ground state and emits a corresponding visible photon. The number of electrons in the elevated energy state is proportional to the visible light intensity used for recording. Thus, as a result of such characteristics, such materials can, in effect, "store" light energy.

The purely photo-electronic mechanisms involved in such electron trapping materials obviate the need for any thermal excursions and, therefore, the number of electrons trapped in the material is inherently linear. Since localized resolution of the "write" step depends only on the performance of the addressing optics, an optical writing spot diameter of one micron will allow at least 550 megabytes of storage on a 130 mm or 5¼" disk coated with the thin film material as disclosed herein. With the use of encoding techniques such as MFM, modified MFM, or record length limiting (RLL), which techniques are commonly used with magnetic disk recording, the storage capacity can be increased by up to a factor of 3 over the use of FM or frequency modulation coding. The rise and fall times associated with optical read and write pulses are in the nanosecond range. Thus, the read and write data transfer rates have been found to be at least 200 megabits per second for optical disk drive media utilizing electron trapping materials.

Rotating disk memory systems require directions for the retrieval of the stored information. One set of those directions informs the drive mechanism where the requested information is or will be stored. The other set provides alignment for the read/write mechanism during processing. The alignment parameters include focusing, speed, tracks, and mark locations. The writing of information is dependent upon the media used such as write once, magneto-optic, dye polymer, or phase change,, but in all cases, involves a change in the reflection parameters in the spot written to. The read method is based on detecting such reflectivity changes at the surface of the disk.

The common method presently used for tracking with reflective surface optical disks, such as the compact disc, is to rely on a grouped track as the principal mode of aligning and focusing the read/write head in the middle of the track. The speed information is either contained in the repetitive pattern of marks or in a depth modulation of the group.

Yet another tracking method presently utilized is known as the "Sampled Servo" system. This system relies on changes in the reflection of spots on the disk surface. The spots are located in the manner which provide information about the track location, the speed of the disk and the adequacy of focusing.

The erasable optical disk memory systems disclosed herein, which rely upon a thin film of electron trapping material as the media, do not rely on reflection for readout. Rather, the emission of the media under infrared stimulation can be utilized to retrieve pre-written tracking information from the disk.

SUMMARY AND OBJECTS OF THE INVENTION

In view of the foregoing, it should be apparent that there exists a need in the art for a method of and apparatus for operating and constructing an erasable optical disk memory system in which electron trapping material used as the storage media permits writing, reading, and erasing essentially an unlimited number of times. It is, therefore, a primary object of this invention to provide a method of and apparatus for operating and constructing an erasable optical disk drive system which is characterized by an electron trapping media such that the write, read, and erase functions can be accomplished with high density, speed and without serious degradation over a large number of erased functions.

More particularly, it is an object of this invention to provide an erasable optical disk memory system for information storage which is capable of storing orders of magnitude more data per disk than inductive magnetic media systems.

Still more particularly, it is an object of this invention to provide an erasable optical disk drive memory system in which data is stored as light energy and which is not dependent upon the reflective properties of the disk for effecting storage or readout of stored information.

Briefly described, these and other objects of the invention are accomplished in accordance with its apparatus aspects by providing a disk containing a coating of thin film electron trapping material which is rotated in a manner similar to that of magnetic hard disk drives, also known as Winchester disk drives. Data is read onto the disk in the form of a write laser operating at a wavelength of visible light, preferably with wavelengths peaking between 450 and 600 nanometers and preferably at about 450 nanometers. A read laser is utilized to irradiate the disk with near infrared radiation having a wavelength with peaks between 700 and 1,450 nanometers, but preferably at about 1,000 nanometers. When stimulated by the near infrared read radiation, any stored bits (representing, for example, a binary one) will cause a predetermined radiation emission characteristic that peaks in the orange light band, at about 620 nanometers. Such a detected emission corresponds to a binary one recorded at that point. The absence of such radiation emission characteristic corresponds to a binary zero recorded at that point.

The optical disk memory storage system of the present invention also includes an optical processing unit for transmitting both the read and write laser beams to the read/write head, as well as various detector electronics and positioning electronics for positioning the head over the disk. Data output and data input is handled by a standard computer interface.

With these and other objects, advantages and features of the invention that may become hereinafter apparent, the nature of the invention may be more clearly understood by reference to the following detailed description of the invention, the appended claims and to the several drawings attached herein.

BRIEF DESCRIPTION OF THE DRAWINGS

FIG. 1 is a diagram showing the principles of operation of the thin film storage media applied to the surface of the disk used with the present invention;

FIG. 2 is a graph showing the trap-filling efficiency of a particular electron trapping film suitable for use with the present invention as a function of the wavelength of the exciting energy;

FIG. 3 is a graph showing the relative infrared sensitivity for the read and erase functions for the same particular electron trapping material as FIG. 2;

FIG. 4 is a graph showing the wavelengths of emission from the disk upon their infrared illumination for the same particular electron trapping material shown in FIGS. 2 and 3;

DETAILED DESCRIPTION OF THE PREFERRED EMBODIMENTS

Figure 5:
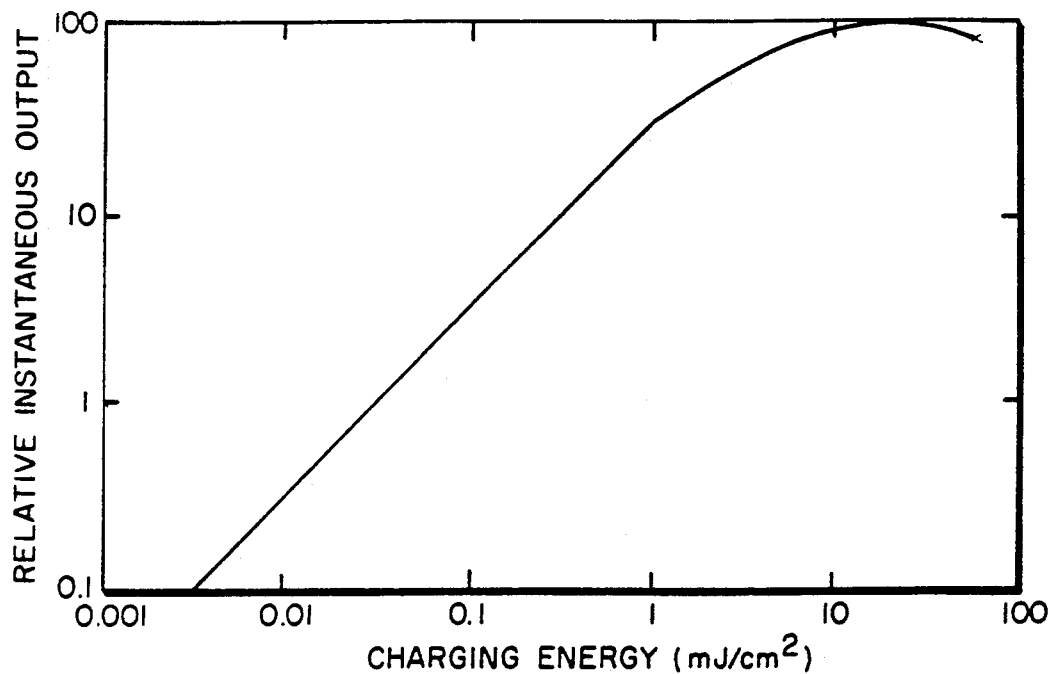
FIG. 5 is a graph of the relative luminescence or read output as a function of write energy for the same particular electron trapping material as shown in FIGS. 2-4.

Referring now in detail to the drawings wherein like parts are designated by like reference numerals throughout, there is illustrated in FIG. 1 an explanation of the basis of the operation of the class of optical storage media electron trapping materials used with the erasable optical disk drive memory system of the present invention. As illustrated in FIG. 1, the wide bandgap host material includes selected impurities which are associated with energy levels ET. The narrow E band is designated as the communication band since electron interaction is allowed there. At level T, which is referred to as the trapping level, the trapping sites are non-communicating because they do not allow electron interaction.

As indicated in FIG. 1, visible radiation, or charging light, excites carriers so that they can fill the trapping sites. The trapped depth in these group II-VI phosphors, of about 1.2 electron volts, is sufficiently above the thermal energy range of the phosphors such that electrons cannot be dislodged by thermal agitation. By controlling the trapped density, the tunneling interchange at trapping level T may be cut off. Under such conditions, the trapped electrons cannot communicate with each other, and the possibility of recombination is thus eliminated.

When the charging radiation terminates and the electron trapping material is in its electronically energized state, the traps are filled, communication band E is empty, and recombination from trapping level T to valence band G is nonexistent. As a consequence, the electrons in the trapping level T will remain or be "stored" there for a time which approaches infinity.

If the charged electron trapping material is then exposed to infrared or near infrared light, sufficient energy equal to the difference between the energy of an electron in the communication band E minus the energy of an electron at trapping level T is provided which serves to move electrons from the trapping level T to the communication band E. While in the communication band E, the electrons may interact and then return to the ground state or valence band G. However, as the electrons return from the communication band D to the valence band G, a photon of energy E minus G is emitted. By the selection of an appropriate doping rare earth element, the wavelengths of light given off by the photon emitted when an electron falls from the communication band E down to the valence band G can be predetermined. The sensing of the occurrence of such an emission serves to indicate whether a particular point being addressed on the disk surface contained a bit (signifying a 1) or no bit (signifying a 0), or vice versa.

In contrast to the physical changes which occur by the use of a writing laser beam in known approaches to erasable (and non-erasable) optical storage systems, the writing and erasing of a spot on the surface of electron trapping materials requires only a change in the energy state of the electrons at that spot. Since no heating is involved, latent, defect induced read, write, and erasable forms of degradation do not occur. Consequently, the number of switching cycles in the electron trapping material is virtually unlimited, exceeding 10 million write/erase cycles with no observed change in the thin film.

The filling of the traps at trapping level T requires that a threshold energy be exceeded. A characteristic curve for the preferred electron trapping material for use as the storage media with the present invention, is shown in FIG. 2. That preferred material is disclosed in pending U.S. Pat. No. 4,842,960. As shown in FIG. 2, the threshold energy level which must be exceeded in order to fill the trapping level T begins at wavelengths of visible light shorter than 600 nanometers.

After the traps contained in the trapping level T are filled, impingement of near infrared radiation can cause electrons to be released. A graph showing the relative infrared sensitivity versus the peaks of the infrared radiation is shown in FIG. 3. In all instances, the graphs shown in FIGS. 2-5 are for the same material described in connection with FIG. 2. As shown in FIG. 3, for the material discussed herein for use with the preferred embodiment, the most efficient rate of release occurs at wavelengths having peaks of just under 1 micron, or at about 1,000 nanometers.

As shown in FIG. 4, when the thin phosphor film disclosed herein for use in the preferred embodiment is stimulated by infrared radiation having peaks whose wavelengths are shown in FIG. 3, the phosphor film displays an emission characteristic that peaks in the orange light band, at about 620 nanometers. It should be noted, however, that FIGS. 2-5 are only representative and that peak wavelengths can be altered by changing the rare earth element dopants. In addition, the spectral widths of the responses can also be altered within certain limits.

The number of electrons trapped in the higher energy state at trapping level T is proportional to the amount of writing energy incident on the surface of the thin film electron trapping material. As shown in FIG. 5, saturation is reached, for the thin film material useful for the preferred embodiment, at a level of about 5 millijoules per square centimeter. At lower flux levels, linearity is observed through orders of magnitude. In addition, the read-out emission is also linear with respect to the intensity of the write beam. This linearity characteristic of the electron trapping material allows such material, using the optical disk drive system disclosed herein, to record and read back analog signals, such as video or analog data transactions, using amplitude modulation, which is not possible with other optical disk drive systems.

If the traps contained in the trapping level T are physically separated by more than a tunneling distance, they do not communicate with each other and self-discharge is eliminated. This condition corresponds to a highest density of excited electrons on the order of about $10^{20}$ per cubic centimeter. Each time an infrared signal is applied to the charged electron trapping film, emission of orange light occurs. Of course, with each photon emitted, the number of electrons remaining in traps in the trapping level T is reduced. Depending on the sensitivity of the detector which, in this case is at 620 nanometers, many readings can be made before the traps are depleted. For the examples given herein, complete erasure of a bit storage spot 1 micrometer in diameter requires approximately 1 picojoule of infrared energy. Of course, depletion can be avoided, if necessary, by periodic refreshing of the stored data.

As briefly described above, the ability of electron trapping materials to "store" energy received in the form of light and to later release that energy upon interrogation by another light beam, comprises the means of digital switching used by the storage media of the present invention. Data points on the storage media surface that have electrons trapped in the elevated state can be interpreted as "on" or a binary one, while those with no electrons in the elevated state are interpreted as "off" or binary zero. Conversely, changed data points can be interpreted as "zeros" and unchanged data points as "ones". It is also possible to "charge" the entire disk with visible light and to write data using the infrared read beam. In that case, the ones or zeros would be stored on the disk at points which have been discharged and vice-versa. Also, only a single infrared beam would be necessary to both read and write data.

Since at each such spot there are sufficient electrons that can switch energy states, the present invention optically determines whether a spot is a binary zero or one without altering the "switch" setting. That is accomplished by interrogating the spot with an infrared beam of low intensity in order to release a small fraction of the elevated energy electrons, enough to determine whether or not the spot is a binary one or binary zero. However, as a practical matter, not enough of the elevated energy electrons are released to significantly deplete the inventory of energized electrons stored at that spot. Utilizing the particular electron trapping thin film materials discussed herein for media storage, switching or write/erase speeds of 5 nanoseconds or less are achieved.

It is also possible to coat multiple layers of differently doped electron trapping materials, one on top of the other. Since each layer produces a different wavelength of output emission, it is possible to separate the read beam signals on that basis. Binary codes can additionally be used to distinguish between layers.

In addition, the read, write and erase laser power requirements for the present invention are low. It is sufficient for the write energy to be a fraction of 1 picojoule per cubic micron, for example, about 0.5 picojoule per cubic micron. The read energy is at femtojoules, for example, about 10 femtojoules per cubic micron. The erase energy is about 1 picojoule per cubic micron. In watts, the write laser power is preferably about 0.1 mW, the read laser power about 0.5 mW and the erase laser power is preferably about 2.0 mW.

Figure 6:
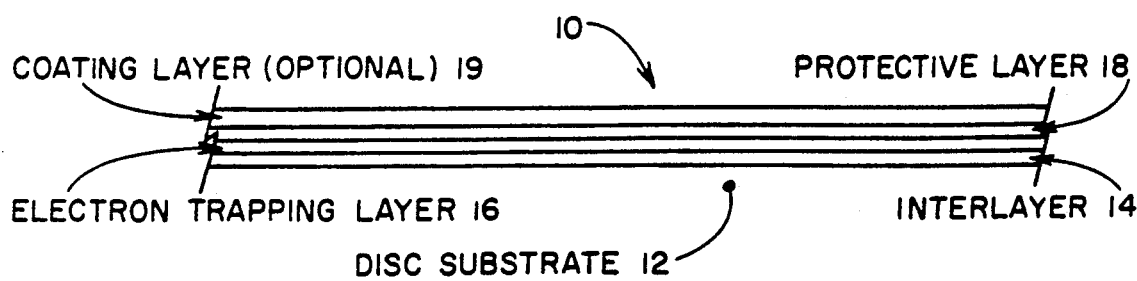
FIG. 6 is a pictorial diagram of the structure of the optical disk used with the present erasable optical disk memory system.

FIG. 6 is a side view of an optical disk showing the disk substrate 12 upon which the electron trapping layer 16 is deposited. The disk substrate 12 is preferably made from an optical alumina material. However, it could also be made from other materials such as optical glass, which can be readily coated with a thin film material and withstand the temperatures necessary to fuse, the crystalline structure of the thin film material. The first material deposited onto the disk substrate 12 is an interlayer material 14 with a thickness of about several hundred Angstroms. The purpose of this interlayer 14 is to define a crystalline surface structure for the electron trapping layer. It also provides a chemical barrier to prevent any leaching of the substrate material into the electron trapping layer 16. Any suitable material, such as CaO, $MoO_3$ or ZnS may be used, however ZnS is preferred. Any suitable deposition process may be utilized.

The second layer deposited on the disk 10, on top of the interlayer 14, is the electron trapping layer 16. The thickness of the electron trapping material 16 is preferably about 5 microns. The deposition processes described in the pending U.S. patent applications referenced and incorporated herein may be used to deposit this layer onto the interlayer 14 already deposited onto the disk substrate 12.

A third or protective layer 18 is sputtered, evaporated, electron beam deposited or laid down on top of the electron trapping layer 16 by any other known deposition method. The protective layer 18 serves to chemically protect the electron trapping layer 16 from chemical contamination. It chemically seals the electron trapping layer 16. The protective layer 18 also serves to provide an optically clear coating over the electron trapping layer 16. It may preferably be comprised of aluminum oxide or some other suitable material.

A fourth layer 19 of plastic or some other optically clear sealing material may optionally be used to coat the protective layer 18. This coating layer 19 functions as do similar coatings on audio compact discs, as a barrier to environmental contaminants.

An optical disk 10 configured as described above and as shown in FIG. 6 can be formatted by means of a laser which burns through the layers over the electron trapping layer 16 and permanently damages the electron trapping layer 16 in a pattern indicative of the required formatting and track indicating information. Formatting and track indicating information schemes, such as those used with conventional Winchester disk drives or WORMs, can be utilized in this fashion to serve the same function with the instant optical disk drive system.

The method of damaging the electron trapping layer 16 functions as follows. The electron trapping material disclosed for use herein produces an instantaneous orange light when exposed to the visible light write laser beam, in addition to causing the storage of electrons in the trapping level T. That instantaneous emission, when exposed to the writing laser beam, can be used to elicit the stored tracking and formatting information by turning on the write laser beam when over the formatting and tracking portions of the disk. The bit areas damaged by writing at a much higher than normal wattage, such as 5 milliwatts using the read/erase laser beam, when struck by the write laser beam will not store an electron, and will not give off an instantaneous orange light.

Since a binary pattern of ones and zeros can be configured by using a strong laser as described above, the damaged areas which do not give off orange light correspond to binary zeros. The undamaged bits of the format and tracking information portions of the disk will give off an orange light which represents a binary one. In that manner, the format and tracking schemes used with Winchester disk drives or WORMs can be utilized by the present optical disk drive system. In a like manner to Winchester hard disk drives, an index signal can be provided by means of Hall effect devices contained in the spindle motor which rotates the optical disk. Two such devices ar usually provided for redundancy for purposes. Other known schemes for producing an index signal can also be utilized.

Figure 7:
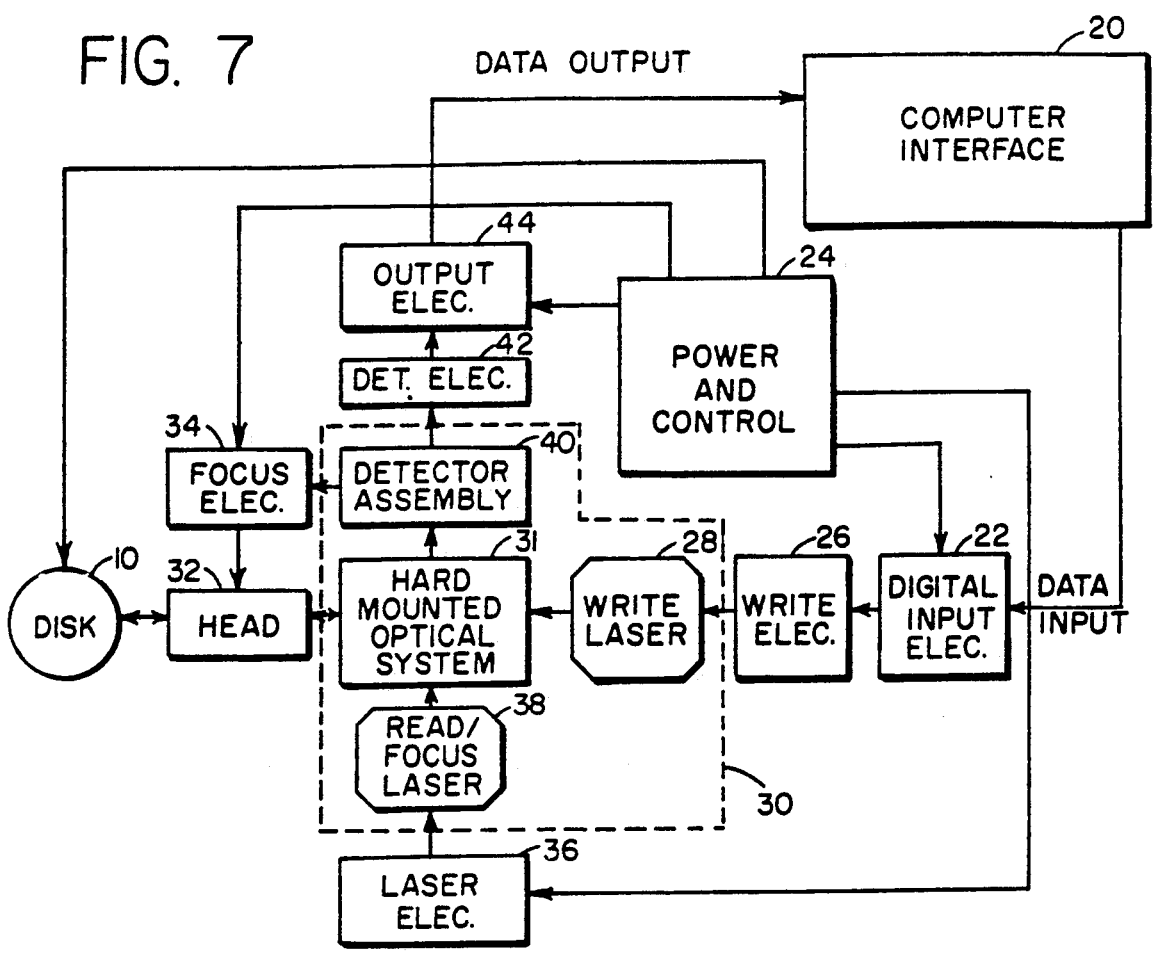
FIG. 7 is a schematic block diagram of the electronics and optics necessary for reading, writing, and erasing data onto and from the disk.

Referring now to FIG. 7, there is shown therein a schematic block diagram of the electronics and optics used for reading and writing data to and from the disk and transmitting that data to a host computer. The data from the host computer (not shown) is fed through a computer interface 20, which may, for example, be a standard ST506 interface as commonly used with Winchester disk drives and WORMs, or may be any other suitable interface. Data is output from the computer interface into the digital input electronics 22 of the drive. The digital input electronics, under microprocessor control from the power and control circuitry 24, serve to format the data received from the computer interface 20 into a form appropriate to be used by the write electronics 26 to control the operation of the write laser 28.

One of the functions of the digital input electronics 22 is to convert the data received from the computer interface 20 into serial form so that it can be used by the write electronics 26 to modulate or turn on and off the write laser 28. The write laser, which may preferably produce a visible light beam having peaks around 460 nanometers, has its amplitude modulated beam processed by the optical processing unit 30 which transmits the processed write beam to the head 32 which then focuses the beam onto the disk 10. The focus electronics 34 operate to produce a beam of about 1 micron in diameter for writing data to the disk.

The write laser could be a gaseous laser, such as an Argon laser. However, in order to construct the entire optical disk drive system including lasers, laser power supply and associated drive and laser control electronics circuitry in a package the size of a standard 5¼ inch drive of half or full height size, i.e., 5.75 in. wide × 8 in. deep × 1⅝ in. in height or, 5.75 in. × 8 in. × 3.5 in., a solid state component must be used. Since no solid state lasers are presently available which produce a beam having a peak in the visible light range, the present invention utilizes a solid state frequency doubling diode, such as the 840 nm diode laser with collimating optics and doubler available from Matsushita Corporation of Japan. The write electronics 26 are provided with such diode laser. The digital input electronics 22 are the same as such electronics used in Winchester disk drives or WORMs.

In order to read the data written onto the disk, as well as the format and tracking information contained on the disk, the microprocessor contained in the power and control unit 24 causes the laser electronics 36 to activate the read laser 38 to amplitude modulate or turn on and off its infrared beam which is transmitted to the hard mounted optical system 31. As described hereinbefore, it is preferred that the read laser have a wavelength peaking at approximately 1 micron or 1,000 nanometers. The hard mounted optical system 31 of the optical processing unit 30 transmits the processed read laser beam, by means of the head 32 and focus electronics 34, onto the surface of the disk 10 in order to cause the stored electrons written as binary ones by the write laser to leave the electron trapping layer T and to release photons. The photons are sensed by the head 32 which transmits them to the optical processing unit 30. After processing by the hard mounted optical system 31, a light beam having peaks at a wavelength of about 650 nanometers is transmitted to the detector assembly 40 and then to the detector electronics 42 where that beam is converted into an electrical signal corresponding to the data pattern of sensed photons.

The output from the detector 42 is fed to the output electronics 44, which among other functions, converts the serial data stream from the disk into a parallel data stream for output back through the computer interface 20 to the host computer. Such output electronics a those used in Winchester hard disks or WORMs can preferably be used as element 44. The detector assembly 40 also functions, using a feedback loop system, to provide a feedback signal to the focus electronics 34 which maintain the head focus of the read and write laser beams on the disk.

The read/focus laser may preferably be a 'GALA' laser diode, model no. 1-9107 available from D.O. Industries. It produces an infrared laser beam having a peak at 830 nm. Alternatively, the read/focus laser 38, associated laser electronics 36, detector assembly 40, detector electronics 42, focus electronics 34 as well as much of the hard mounted optical system 31, as will be described in greater detail later, can be a Pencom Holographic Optical Head, model no. 02 and Pencom laser drive and focus actuation electronics model no. 1800, available from Pencom International Corporation. The head 32 can preferably be an Olympus 'TAOHS' autofocusing objective, model no. p37, available from Olympus Corporation of Japan.

The power and control section 24 of the drive also serves to maintain the optical disk at a constant rate of rotation in a known manner utilized by Winchester disk and WORM drive systems. It is preferred that the optical disk be rotated at a rate of at least 4000 rpm. Because the optical disk drive system of the present invention does not utilize a head which rests upon the surface of the disk when the disk is not rotating, there is no necessity to secure the disk from rotation when the drive is powered off. The power and control electronics 34 do, however, rotate the disk at a uniform speed and with a minimum of wobble as is commonly done by magnetic Winchester hard disk drives and WORMs. Both of those functions can be accomplished in any known manner.

Figure 8:
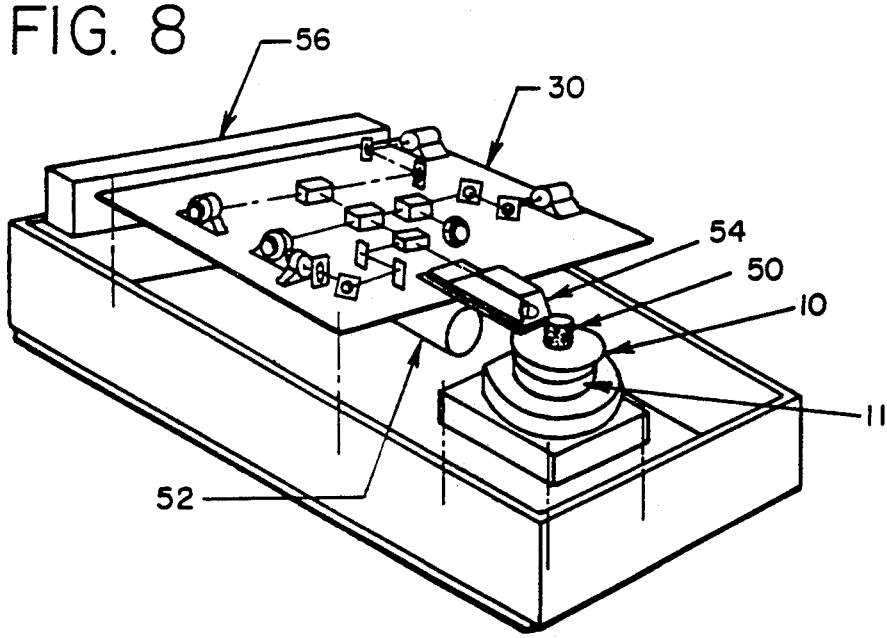
FIG. 8 is a pictorial partially cut-away drawing of the optical disk storage system of the present invention.

Referring now to FIG. 8, there is shown therein a cutaway pictorial drawing of the optical disk drive system of the present invention. The drive includes a spindle motor 11 which drives spindle 50 to which at least one disk 10 is rigidly mounted. The disk 10 is shown proportionately smaller than it actually is for purposes of clarity. As discussed herein, the disk drive system of the present invention has dimensions such that it fits within a standard slot of a personal computer for receiving a 5¼" Winchester disk drive, floppy drive, or WORM. The optical disk itself it preferably of diameter of about 130 millimeters with an inside diameter of 40 millimeters, that is, the same general size as a standard magnetic 5¼" hard disk. The drive also includes an actuator drive motor 52 which is shown as a linear actuator, for positioning the head 54 over the disk 10. Although the actuator drive motor is shown as a linear actuator, as is known in the art, a rotary type motor with a rotary positioning mechanism can alternatively be used.

The optical disk drive system of the present invention has the following specifications:

| DRIVE SPECIFICATIONS | |
|---|---|
| Disk | |
| Track number/side | 19,700 |
| Track pitch | 1.6 micron |
| Recording material | ETOM ™ |
| Data transfer rate | 200 Mbits/sec. |
| Storage Capacity | 500 MBytes per side |
| Drive | |
| Rotation method | CAV |
| Disk rotation speed | >4000 rpm |
| Write laser power | 0.1 mW |
| Write laser wavelength | 450 nm |
| Read laser power | 0.5 mW |
| Read laser wavelength | 830 nm |
| Erase Power | 2.0 mW |
| Mass of moving carriage | <10 g |
| System | |
| Disk diameter | 130 mm |
| Data transfer rate | >40 Mbits/sec. |
| Average access time | 20 ms |
| C/N ratio (bandwidth 30 kHz) | 57 dB |
| Error rate (without ECC) | $10^{-6}$ |
| Error rate (with ECC) | $10^{-12}$ |
| Direct read after write | Yes |

As described briefly in connection with FIG. 7, the disk drive of the present invention also utilizes an optical processing unit 30, which will be described in more detail in connection with FIG. 10. An electronics card cage 56 for supporting electronic circuit boards in a plane parallel to the optical processing unit may also be included in the construction of the optical drive system of the present invention. It should be noted that in order to operate properly, the entire disk drive system should be enclosed in such a manner that outside light and contaminating particles cannot reach the surface of the disk. That practice is commonly used in connection with Winchester disk drives, as is a particle filtration system which can also preferably be used with the drive of the present invention.

It should also be noted that although FIG. 8 shows an embodiment of an optical disk drive of the present invention with a single optical disk, such optical disk drive could be configured with an additional head in order to utilize the bottom surface of the disk 10, once it had been appropriately prepared in a manner as described hereinabove. In a like manner, a plurality of heads and disks can be utilized in order to increase the storage capacity of the optical disk drive system. The disk 10 could also be coated with additional electron trapping layers to increase its storage capacity.

Figure 9A:
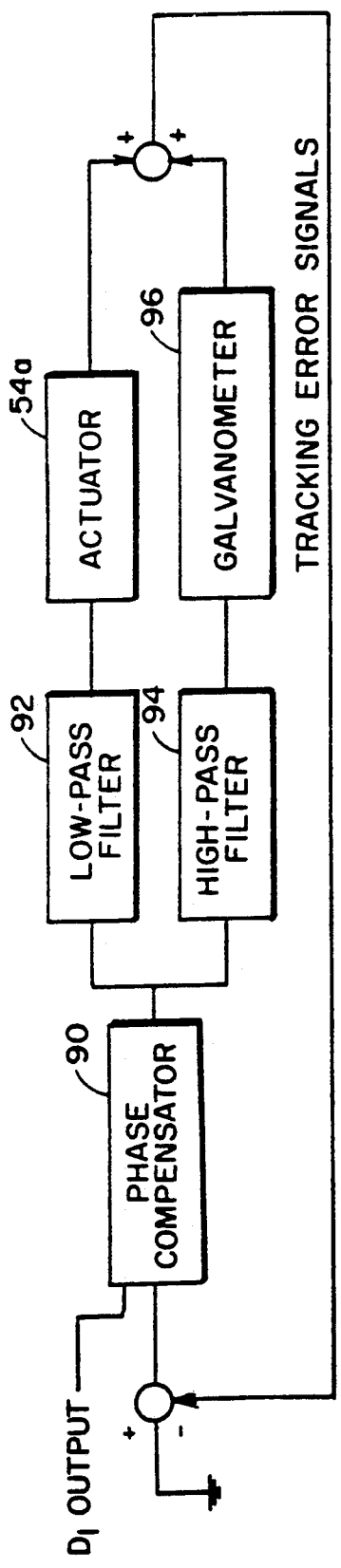
FIGS. 9A and 9B are a schematic block diagram of the position servo tracking and velocity servo tracking circuitry for use with the optical disk drive memory system of the present invention.
Figure 9B:
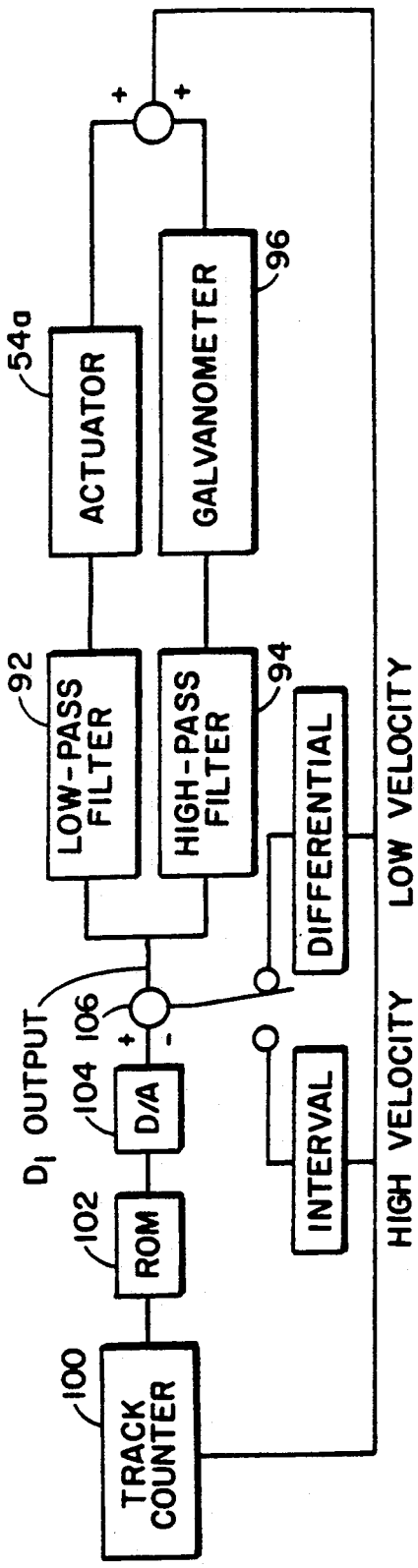

The erasable optical disk drive system of the present invention preferably uses a tracking system similar to or the same as is currently known and used with WORM drives. An alternative servo tracking system, designed specifically to operate a rotary actuator mechanism for use with the present invention, is shown in FIGS. 9A and 9B. The circuitry of FIG. 9A is a position tracking servo system which provides track following functions. The FIG. 9B circuitry provides the velocity feedback signals for track seeking operations.

Referring now to FIG. 9A, there is shown a schematic block diagram of the position tracking servo system for use with a rotary actuator coarse positioning mechanism together with a galvanometer-based fine tracking mechanism. The rotary actuator mechanism, as is known in the disk drive art, works mainly in a lower frequency range below its resonances while the galvanometer operates at a higher frequency range. The rotary actuator/galvanometer system functions as if it were a resonance-free actuator because the crossover frequency between the two subsystems is high enough to neglect the movement of the galvanometer which is mechanically separated from the rotary arm actuator.

Figure 10:
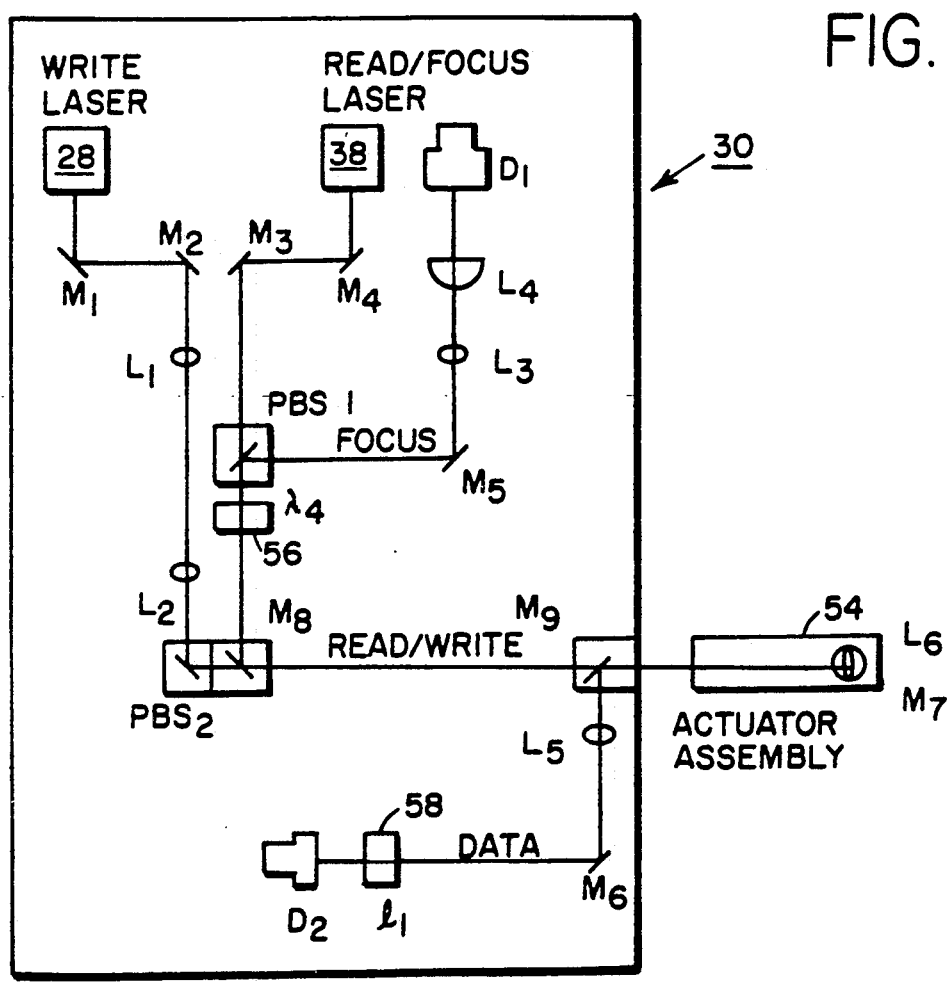
FIG. 10 is a schematic block diagram of the optical processing unit and actuator arm assembly for use with the optical disk drive memory system of the present invention.

The output from the detector $D_1$ of FIG. 10 is fed into a phase compensator 90 of FIG. 9A. The output from the phase compensator 90 is fed to the inputs of both low-pass and high-pass filters 92 and 94 respectively. The output of the low-pass filter 92 is used to drive the actuator 54a while the high-pass filter 94 output is fed to the galvanometer 96. In a known manner, a tracking error signal is generated by the operation of the actuator 54a and galvanometer 96, which is fed back ultimately to the phase compensator 90. In this manner, the feedback loop of FIG. 9A reduces the off-track errors for the rotary actuator 54a to the range of tenths of a micron. The galvanometer 96 reduces that error to a range of hundredths of a micron. Since the angular range of the galvanometer is in the order of seconds, any tracking offset caused by beam deflection is negligible.

FIG. 9B is a schematic block diagram of the velocity tracking servo system for use with the present invention. The track seeking operation is executed under a known velocity-profile system. A laser beam spot, starting from a track, lands on a target track after acceleration, constant velocity movement, and, finally, deceleration. During the deceleration phase, the velocity is controlled by referring to a distance-velocity table stored in the ROM 102, which is programmed such that the velocity of the actuator 54a becomes almost zero at the target track. The distance between the starting point and the target track is measured by track-crossing signals and counted by track counter 100. The velocity in the high velocity range is obtained from the time duration of each signal. In the lower velocity range, the time duration is obtained from the differential of the signal at each zero-crossing point.

The output from the track counter 100 is inputted to the ROM 102 whose digital output is converted to a corresponding analog signal by digital-to-analog converter 104 and fed to a differential amplifier 106 whose output is fed to both the low and high pass filters, 92 and 94. The outputs of those filters are used to drive the actuator 54a and galvanometer 96. The differential 106 is also connected to receive a signal indicating whether the actuator is to be driven in either high velocity or low velocity mode.

FIG. 10 is a block diagram of a preferred embodiment of the optical processing unit 30. Also shown is the actuator assembly 54. The modulated beam of the write laser 28 is reflected from a first broad band mirror $M_1$ to a second broad band mirror $M_2$ and then passes through two lenses $L_1$ and $L_2$ until it reaches an element of a polarizing beam splitter $PBS_2$ which preferably provides as an output a laser beam with peaks at a wavelength of about 450 nanometers. $PBS_2$ is preferably a 488 nm polarizing beam splitter cube, model no. 03PBS 013, available from Melles Griot Corporation. Lens $L_1$ is preferably a 50 millimeter precision optimized achromatic doublet lens while lens $L_2$ is preferably a 200 millimeter precision optimized achromatic doublet lens, both available from Melles Griot Corporation. After being reflected by the polarizing beam splitter $PBS_2$, the write laser beam passes through mirror $M_8$, which is an 850 nm reflector, and then through mirror $M_9$, which is preferably a 650 nanometer wavelength reflector mirror, and onto lens $L_6$ which is an Olympus 'TAHOS' autofocusing objective as discussed above. The 450 nm write beam is then reflected by broad band mirror $M_7$ and translated 90° to impinge onto the surface of the optical disk 10. The lens $L_6$ and broad band mirror $M_7$ are contained on the actuator assembly 54 which includes an actuator arm assembly and head.

The 650 nm reflector $M_9$ may preferably be a 6328 dielectric reflector, model no. 02 MFG007/279, available from Melles Griot Corporation. It functions to reflect only wavelengths which peak around 650 nm, such as the orange light or data given off by the electron trapping layer 16 of the disk 10 in response to the read laser beam. The mirror $M_7$, which reflects the incident write and read laser beams to focus on the lens $L_6$ into a path 90° away from the incoming beams, is preferably a broad band reflector, model no. 10D10BD-1, available from Newport Corporation. Mirrors $M_1$ and $M_2$ may preferably also be the same mirror as mirror $M_7$. Mirror $M_7$ also functions to reflect into a path 90° away from the incoming path the data stored on the disk in its orange light form and focused onto the mirror $M_7$ by the lens $L_6$. Such "light beam" is really a stream of orange light or "bits" read from the disk 10. The actuator arm assembly may be of any known construction. Suitable such assemblies are utilized in well known WORM drives.

The read/focus laser 38, which preferably has its peak wavelength in the infrared range centered around a wavelength of 1,000 nanometers, is first reflected 90° by a broad band mirror $M_4$ and then another 90° by a second broad band mirror $M_5$ which directs the read/focus laser beam to the back of a polarized beam splitter $PBS_1$ having a wavelength centered about 830 nanometers. The read/focus beam, which is polarized in a plane parallel to the surface of the drawing, passes through the polarized beam splitter $PBS_1$ and through a quarter wave plate $\lambda_4$, which may preferably be a model no. 02URQ001 available from Melles Griot Corporation. The quarter wave plate changes the polarization of the read beam to circular polarization. The read beam then impinges on an 850 nm reflector mirror $M_8$, which bends the beam 90° to impinge on the 650 nm dielectric reflector mirror $M_9$. The read/focus beam passes through the mirror $M_9$ in the same manner as the write laser beam and impinges onto the lens and mirror combination $L_6$ and $M_7$ of the head 32 secured to the actuator assembly 54 which focuses it onto the surface of the disk 10.

A portion of the read/focus beam is reflected off of the surface of the disk 10, through the objective formed by lens $L_6$ and mirror $M_7$ and through mirror $M_9$ to mirror $M_8$. Due to its reflection off of the disk 10 surface, the polarization of the focus beam is now in the opposite circular direction to the circular polarization of the read/focus beam. The focus beam is reflected 90° by the mirror $M_8$ and through the quarter wave plate $\lambda_4$, which changes its polarization to vertical or perpendicular to the surface of the drawing. It then impinges onto the front of the polarized beam splitter $PBS_1$, which may preferably be a 830 nm polarized beam splitter tube, model no. U3 PBS063, available from Melles Griot Corporation. The beam splitter $PBS_1$ reflects the focus beam at an angle 90° to the incident beam which causes the focus beam to impinge on mirror $M_5$, which may preferably be a diode laser reflector, model no. 10 DIOBD-2, available from Newport Corporation. Mirrors $M_3$ and $M_4$ may preferably be that same part.

The mirror $M_5$ reflects the focus beam at an additional 90° angle such that it is on a path parallel to, but travelling in opposite direction to, the output laser beam from the read/focus laser 38. The focus beam is reflected by mirror $M_5$ onto and focused through a first lens $L_3$, which may preferably be a 75 millimeter precision optimized achromatic doublet lens and then through a second lens $L_4$ which may preferably be a 50 millimeter plano convex cylinder lens model no. 850-50, available from Optics Plus, Inc., and onto a focus/tracking detector $D_1$. Such detector $D_1$ forms a part of element 40 in FIG. 7 and may preferably be a quadrant detector, model PIN-SPOT-40MI, available from United Detector Technology Corporation. The output from detector $D_1$ is utilized by the detector assembly 40 to produce a feedback signal for use by the focus electronics 34 for maintaining the focus of the read and write laser beams by the head 32, as well as providing an input to the detector electronics 42. The hard mounted optical system 31 is formed of the optical elements shown in FIG. 10, excluding elements 28, 38, $D_1$, $D_2$ and the actuator assembly 54 in its entirety.

The photons released by the impingement of the read beam onto the surface of the disk 10 pass through the lens $L_6$ and are bent by the mirror $M_7$ and caused to impinge on the backside of the reflector $M_9$. The reflector $M_9$ translates the outgoing data beam 90° away from the input beam and directs it through a lens $L_5$, which may preferably be a 120 millimeter focal length precision optimized achromatic doublet lens available from Melles Griot Corporation. From the lens $L_5$, the data beam impinges on a cold mirror $M_6$ which translates it 90° to pass through an optional 650 nm interference filter $f_1$ to impinge onto a data read detector $D_2$. The data read detector $D_2$ forms a part of the detector assembly 40 described in connection with FIG. 7. The cold mirror $M_6$ may preferably be a model no. 03MCS007, available from Melles Griot Corporation.

Although only a preferred embodiment is specifically illustrated and described herein, it will be appreciated that many modifications and variations of the present invention are possible in light of the above teachings and within the purview of the appended claims without departing from the spirit and intended scope of the invention.

What is claimed is:

1. An optical disk drive system, comprising:
   at least one optical disk fixedly mounted in a sealed housing, said optical disk comprising electron trapping media for storing and releasing digital information in the form of light energy;
   means for rotatably supporting said optical disk;
   means for rotating said optical disk;
   transducer means comprising at least two light beam generating means and a focusing objective lens for writing digital information on and reading information from said optical disk as light energy on at least one planar surface thereof, wherein said light beam generating means used for writing digital information on said disk generates a light beam having a first predetermined wavelength which raises electronics in said electron trapping media to an elevated energy level at which they are trapped, and said light beam generating means used for reading digital information from said disk generates a light beam having a second and different predetermined wavelength which releases a portion of said trapped electrons, resulting in the emission of light of a third predetermined wavelength;
   positioning means for moving said focusing objective lens between the tracks on said optical disk, said positioning means includes means for detecting said tracks and means for moving said focusing objective lens from one track to the next adjacent track on said optical disk.

2. The optical disk drive system of claim 1, further including a sealed housing in which at least said optical disk, said transducer means, and said positioning means are contained.

3. The optical disk drive system of claim 2, wherein said sealed housing has a width substantially equal to the diameter of said optical disk.

4. The optical disk drive system of claim 2, wherein said sealed housing is of dimensions 5.75 inches in width, 8 inches in depth, and 3.5 inches in height.

5. The optical disk drive system of claim 1, wherein said at least two light beam generating means are contained on a single circuit card.

6. The optical disk drive system of claim 1, wherein one of said at least two light beam generating means produces a beam having a wavelength in one of the near infrared and infrared light spectrum.

7. The optical disk drive system of claim 1, wherein one of said at least two light beam generating means produces a beam having a wavelength in the visible light spectrum.

8. The optical disk drive system of claim 1, wherein one of said at least two light beam generating means produces a beam having a wavelength in one of the near infrared and infrared light spectrum for reading information from said optical disk and another of said at least two light beam generating mean produces a beam having a wavelength in the visible light spectrum for writing information on said optical disk.

9. The optical disk drive system of claim 1, wherein said digital information is written on and read from said optical disk by amplitude modulation of said at least two light beam generating means.

10. The optical disk drive system of claim 1, wherein said optical disk is coated with said electron trapping media on up to two sides, each of said sides having the capacity for storing at least 500 megabytes of information.

11. A method of operating an optical disk drive, including the steps of:
    coating the surface of an optical disk with an electron trapping media which stores digital information in the form of light energy;
    rotatably fixedly supporting said optical disk;
    rotating said optical disk at a constant predetermined rate of rotation;
    impinging focused light beams of at least two predetermined different wavelengths on said disk surface for writing digital information onto and reading digital information from said optical disk, wherein said light beam of a first predetermined wavelength for writing digital information on said disk raises electrons in said electron trapping media to an elevated energy level at which the electrons are trapped, and said light beam of a second predetermined wavelength for reading digital information from said disk releases a portion of said trapped electrons, resulting in the emission of light of a third predetermined wavelength; and
    detecting tracks on said optical disk and positioning said impinging focused light beams from track to track on said optical disk, such that desired digital information is written to and read from said optical disk.

12. The method of claim 11, further including the step of impinging one of the at least two focused light beams of predetermined different wavelengths at a power substantially higher than used to read information on said optical disk, for erasing the information written on said optical disk.

* * * * *